United States Patent [19]
Douseki et al.

[11] Patent Number: 5,486,774
[45] Date of Patent: Jan. 23, 1996

[54] CMOS LOGIC CIRCUITS HAVING LOW AND HIGH-THRESHOLD VOLTAGE TRANSISTORS

[75] Inventors: Takakuni Douseki; Junzo Yamada; Yasuyuki Matsuya; Shinichirou Mutou, all of Kanagawa, Japan

[73] Assignee: Nippon Telegraph and Telephone Corporation, Tokyo, Japan

[21] Appl. No.: 333,235

[22] Filed: Nov. 2, 1994

Related U.S. Application Data

[63] Continuation of Ser. No. 981,183, Nov. 24, 1992, abandoned.

[30] Foreign Application Priority Data

| Nov. 26, 1991 | [JP] | Japan | 3-311007 |
| Dec. 6, 1991 | [JP] | Japan | 3-323382 |
| Dec. 9, 1991 | [JP] | Japan | 3-324512 |
| Feb. 3, 1992 | [JP] | Japan | 4-017537 |

[51] Int. Cl.⁶ .............................................. H03K 19/0948
[52] U.S. Cl. ........................... 326/33; 326/81; 327/541
[58] Field of Search ........................ 307/443, 451, 307/475, 473, 296.8; 326/33, 81, 58; 327/541

[56] References Cited

U.S. PATENT DOCUMENTS

| 4,103,188 | 7/1978 | Morton | 307/451 |
| 4,320,509 | 3/1982 | Davidson et al. | 371/25 |
| 4,435,658 | 3/1984 | Murray et al. | 307/450 |
| 4,473,762 | 9/1984 | Iwahashi et al. | 307/443 |
| 4,714,840 | 12/1987 | Proebsting | 307/443 |
| 4,791,323 | 12/1988 | Austin | 307/443 |
| 4,956,691 | 9/1990 | Culley et al. | 307/475 |
| 4,999,529 | 3/1991 | Morgan, Jr. et al. | 307/475 |
| 5,151,621 | 9/1992 | Gato | 307/443 |
| 5,164,621 | 11/1992 | Miyamoto | 307/296.8 |
| 5,180,938 | 1/1993 | Sin | 307/443 |
| 5,187,386 | 2/1993 | Chang et al. | 307/296.8 |
| 5,200,921 | 4/1993 | Okajima | 307/451 |
| 5,223,751 | 6/1993 | Simmon et al. | 307/451 |

FOREIGN PATENT DOCUMENTS

| 62-194635 | 8/1981 | Japan . |
| 62-194634 | 8/1987 | Japan . |
| 62-194636 | 8/1987 | Japan . |

OTHER PUBLICATIONS

Chen, John Y.; CMOS Devices and Technology For VLSI; ©1990 by Prentice Hall, Inc.; p. 98.
Clocked CMOS Calculator Circuitry by Y. Suzuki et al., IEEE Journal of Solid–State Circuits, vol. SC–8, No. 6, Dec. 1973; pp. 462–469.
Zipper CMOS by C. M. Lee et al., IEEE Ciruits and Devices Magazines May 1986; pp. 10–16.

*Primary Examiner*—Edward P. Westin
*Assistant Examiner*—Benjamin D. Driscoll
*Attorney, Agent, or Firm*—Blakely, Sokoloff, Taylor & Zafman

[57] ABSTRACT

A logic circuit includes a low-threshold logic circuit, a pair of first and second power lines, a first dummy power line, and a first high-frequency logic circuit. The low-threshold logic circuit has a logic circuit element constituted by a plurality of low-threshold field effect transistors. The pair of first and second power lines supply power to the low-threshold logic circuit. The first dummy power line is connected to one of power source terminals of the low-threshold logic circuit. The first high-threshold control transistor is arranged between the first dummy power line and the first power line.

11 Claims, 9 Drawing Sheets

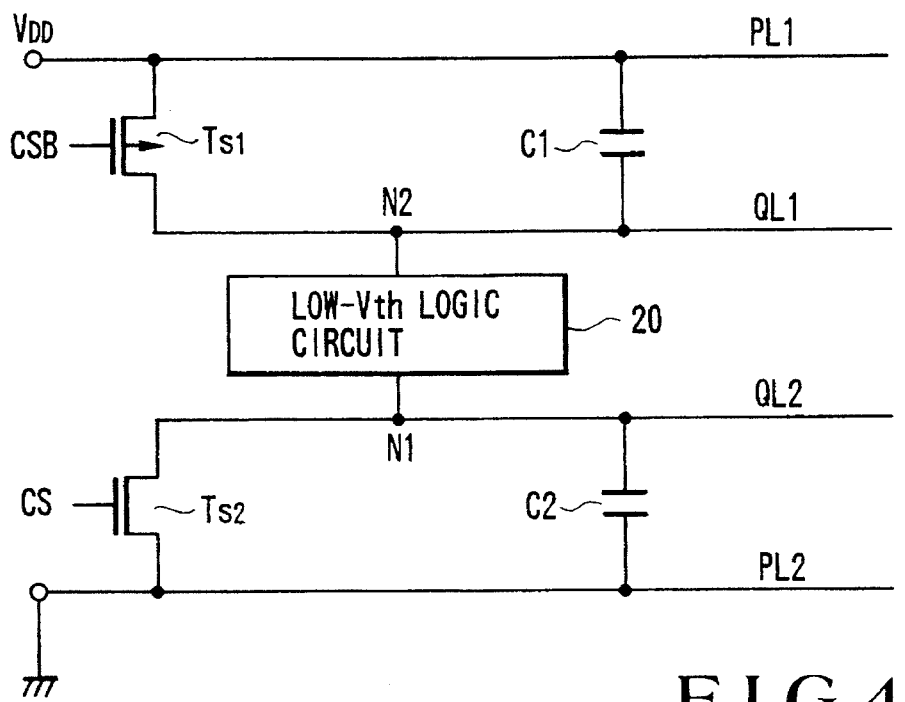
F I G. 4
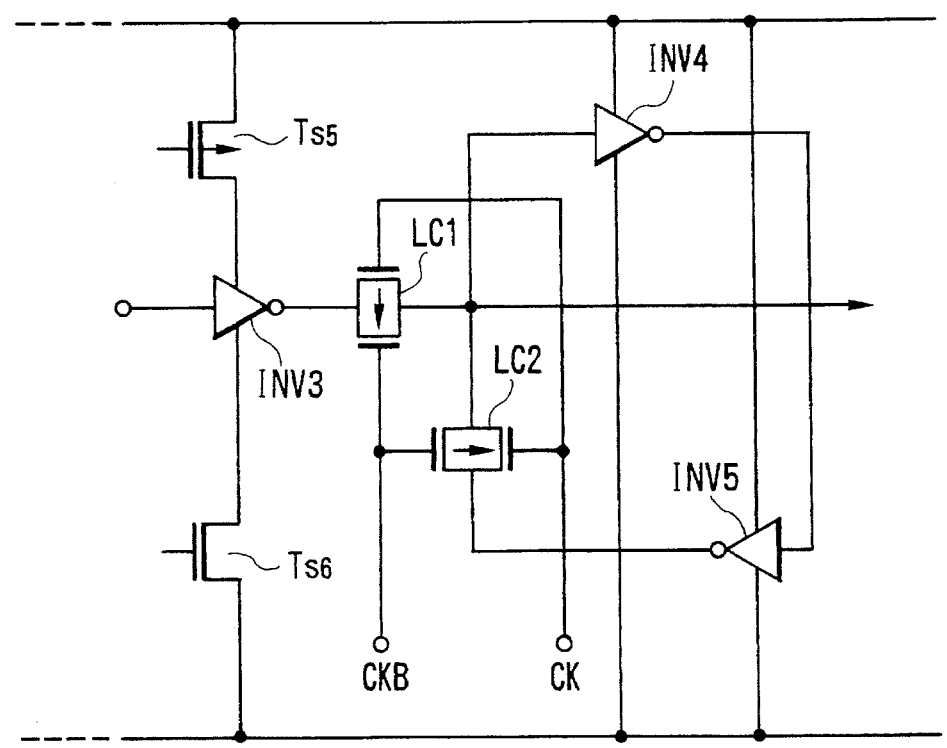
F I G. 5

5,486,774

CMOS LOGIC CIRCUITS HAVING LOW AND HIGH-THRESHOLD VOLTAGE TRANSISTORS

This is a continuation of application Ser. No. 07/981,183 filed Nov. 24, 1992, now abandoned.

BACKGROUND OF THE INVENTION

The present invention relates to a logic circuit and, more particularly, to a logic circuit used in a latch circuit operative at a low power supply voltage of 1 v or less.

A conventional logic circuit of this type is generally constituted by a CMOS logic block circuit, and an example is shown in FIG. 12. In this example, logic elements such as an inverter INV1, NAND gates NAND1, . . . , and an inverter INV2 are connected to power lines $V_{DD}$ and $V_{ss}$ through switching transistors M1, M2, . . . , M3 and switching transistors M4, M5, . . . , M6. With this arrangement, a control signal CSB of high level and a control signal CS of low level are supplied to the switching transistors M1, M2, . . . , M3 and the switching transistors M4, M5, . . . , M6, respectively, to control the operations of the respective logic elements.

Since the switching transistors used in this arrangement, however, are arranged as transistors having a single threshold voltage, the following problems are posed.

For example, assume an operation using a dry cell. When the power supply voltage of this logic circuit is decreased from 5 V (conventional case) to 1 V, the threshold voltage of each transistor comes close to the power supply voltage in an ON state (CS=HIGH and CSB=LOW), and the transconductance of each transistor becomes extremely small to undesirably prolong the delay time of each logic circuit element. When the threshold voltage of each transistor constituting the logic circuit is decreased, a leakage current is increased in an OFF state (CS=LOW and CSB=HIGH), and the endurance of the dry cell is greatly shortened. In addition, the control transistors are rendered nonconductive, and therefore storage information is destroyed.

SUMMARY OF THE INVENTION

It is a principal object of the present invention to provide a logic circuit capable of performing a high-speed operation even if a power supply voltage is decreased.

It is another object of the present invention to provide a logic circuit capable of reducing power consumption even if the power supply voltage is decreased.

In order to achieve the above objects of the present invention, there is provided a logic circuit comprising a low-threshold logic circuit having a logic circuit element constituted by a plurality of low-threshold field effect transistors, a pair of first and second power lines for supplying power to the low-threshold logic circuit, a first dummy power line connected to one of power source terminals of the low-threshold logic circuit, and a first high-threshold control transistor arranged between the first dummy power line and the first power line.

BRIEF DESCRIPTION OF THE DRAWINGS

FIG. 4 is a system diagram showing a modification of the present invention;

FIG. 5 is a system diagram showing another modification of the present invention;

DESCRIPTION OF THE PREFERRED EMBODIMENTS

Figure 1:
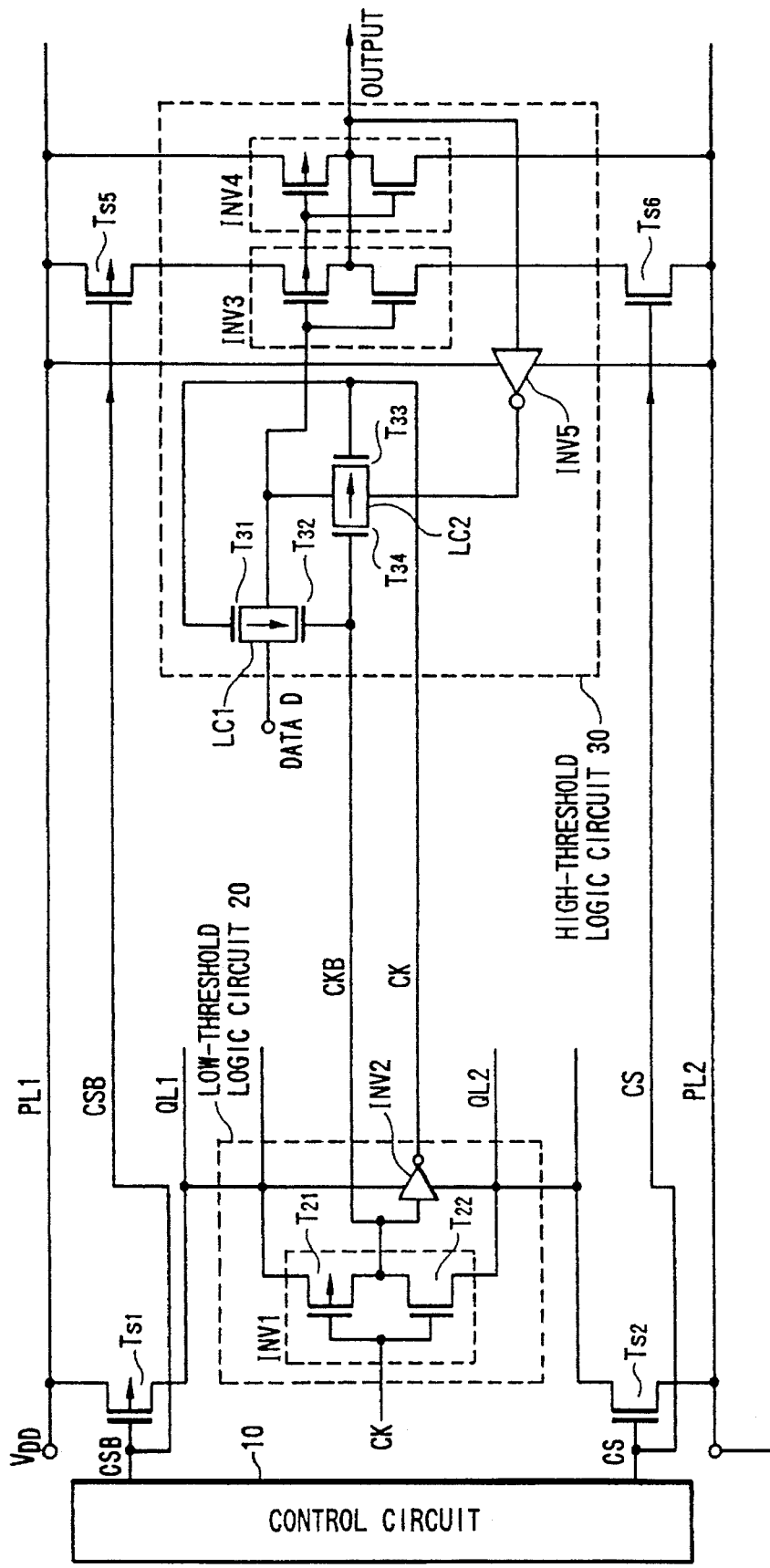
FIG. 1 is a system diagram showing a logic circuit according to an embodiment of the present invention.

FIG. 1 shows a logic circuit according to an embodiment of the present invention. More specifically, FIG. 1 shows the arrangement of a low-threshold logic circuit for receiving a clock signal CK and generating the clock signal CK and its inverted clock signal CKB and a high-threshold logic circuit driven by the clock signals output from the low-threshold logic circuit. Referring to FIG. 1, reference numeral 10 denotes a control circuit for outputting control signals CS and CSB for turning on/off control transistors (to be described later). The control signal CSB is a signal obtained by inverting the control signal CS. Reference symbols $T_{S1}$ and $T_{S2}$ denote field effect MOS control transistors. The transistor $T_{S1}$ is a p-channel transistor for connecting or disconnecting a power line PL1 for receiving a power supply voltage $V_{DD}$ to or from a dummy power line QL1. The transistor $T_{S2}$ is an n-channel transistor for connecting or disconnecting a grounded power line PL2 to or from a dummy power line QL2. Reference symbol 20 denotes a low-threshold (low-$V_{th}$) CMOS logic circuit. This low-threshold logic circuit 20 comprises two inverters INV1 and INV2 for generating the inverted clock signal CKB from the clock signal CK. For example, the inverter INV1 is constituted by two low-threshold MOS transistors T21 and T22 having cascade-connected output electrodes and commonly connected input electrodes. The transistor T21 is a p-channel transistor, while the transistor T22 is an n-channel transistor. One of the output electrodes of the transistor T21 is connected to the dummy power line QL1, and one of the output electrodes of the transistor T22 is connected to the dummy power line QL2. The inverter INV2 is arranged in the same manner as the inverter INV1 except that the inverter INV2 receives an output from the inverter INV1, so that the inverter INV2 is represented by an abbreviated symbol. In this case, according to the present invention, it should be noted that the common dummy power lines QL1 and QL2 are connected to all the logic elements constituting the low-threshold logic circuit 20. The dummy power line QL1 is connected to the power line PL1 (e.g., a $V_{DD}$ potential) through the output electrode of the transistor $T_{S1}$, and the dummy power line QL2 is connected to the power line (e.g., a ground potential) through the output electrode of the transistor $T_{S2}$. The low-threshold logic circuit can be arbitrarily arranged in a variety of circuits using AND, OR, and NAND gates in consideration of application purposes and other factors. The low-threshold logic circuit 20 is not limited to the circuit of this embodiment. The control signals CSB and CS are input to the input electrodes of the transistors $T_{S1}$ and $T_{S2}$.

Reference numeral 30 denotes a high-threshold (high-$V_{th}$) CMOS logic circuit constituted by a latch circuit consisting of two transfer gates LC1 and LC2 and three inverters INV3, INV4, and INV5. Power supply of this latch circuit is controlled through two high-threshold MOS field effect transistors $T_{S5}$ and $T_{S6}$. In this case, the transistor $T_{S5}$ is a p-channel transistor, while the transistor $T_{S6}$ is an n-channel transistor. The transfer gate LC1 is constituted by two low-threshold field effect MOS transistors T31 and T32. The output electrodes of these transistors are commonly connected. One of the output electrodes is connected to a terminal for receiving data D, and the other is connected to the input of the inverter INV3. The input electrode of the transistor T31 receives the clock signal CK, and the input terminal of the transistor T32 receives the inverted clock signal ($\overline{CL}$) CKB. The transfer gate LC2 is arranged in the same manner as the transfer gate LC1. One of the output electrodes is connected to the output of the transfer gate LC1, and the other is connected to the input of the inverter INV3. Each of the inverters INV3, INV4, and INV5 is arranged in the same manner as the inverter INV1. It should be noted that transistors of the inverters INV4 and INV5 are constituted by high-threshold MOS transistors while transistors of the inverter INV3 are constituted by low-threshold MOS transistors. Each transistor constituting the transfer gate LC2 may be a low- or high-threshold transistor.

One of the output electrodes of the inverter INV3 is connected to the power line PL1 through a high-threshold transistor $T_{S5}$, and the other output electrode of the inverter INV3 is connected to the power line PL2 through the transistor $T_{S6}$. The control signal CSB is supplied to the input electrode of the transistor $T_{S5}$, and the control signal CS is supplied to the input electrode of the transistor $T_{S6}$.

The inverter INV4 is connected in parallel with the inverter INV3. The inverter INV4 is different from the inverter INV3 in that the output electrodes of the series-connected transistors are directly connected to the power lines PL1 and PL2 without going through the transistors $T_{S5}$ and $T_{S6}$. The outputs of the inverters INV3 and INV4 are commonly connected to supply an output of the latch circuit to the next stage. In this latch circuit, an inverter INV5 is connected between the outputs of the inverters INV3 and INV4 and one of the output electrodes of the transfer gate LC2.

The inverter INV5 is constituted by two high-threshold transistors. These transistors are directly connected to the power lines PL1 and PL2 in the same manner as the inverter INV4.

With the above arrangement, when the control signals CS and CBS are output from the control circuit 10, and more specifically, when the selection control signal CSB of low level is supplied to the control or input electrode, and the selection control signal CS of high level is supplied to the control or input electrode, the high-threshold control transistors $T_{S1}$ and $T_{S2}$ are turned on, and a potential appears across the dummy power lines QL1 and QL2. For this reason, each logic element constituting the low-threshold logic circuit 20 is set in a state applied with the power supply voltage and performs a logic operation in accordance with the clock signals CK and CKB. At this time, since each logic element constituting the low-threshold logic circuit 20 has a low threshold voltage, a high-speed operation can be performed even if the power supply voltage is decreased.

When the control signals CS and CSB are not selected, i.e., when these signals are not supplied to the transistors $T_{S1}$ and $T_{S2}$ and the transistors $T_{S1}$ and $T_{S2}$ are kept off, no power supply voltage appears across the dummy power lines QL1 and QL2, and the power supply voltage is not applied to the low-threshold logic circuit 20. In other words, the low-threshold logic circuit 20 is rendered inoperative. At this time, since the control transistors $T_{S1}$ and $T_{S2}$ have a high threshold voltage, an increase in power consumption in an OFF state does not occur even if the circuit 20 connected to the outputs of the transistors $T_{S1}$ and $T_{S2}$ is constituted by low-threshold logic elements. Therefore, the operation delay time of this logic circuit can be suppressed.

The operation of the latch circuit driven by the low-threshold logic circuit 20 will be described below.

A signal of the input data D is supplied to the transfer gate LC1 at timings of the clock signals CK and CKB input to the transfer gate LC1 and is supplied to the inverters INV3 and INV4. The inverter INV3 receives the output from the transfer gate LC1 upon reception of the power supply voltage input in synchronism with the control signals CSB and CS output from the control circuit 10. Outputs from the inverters INV3 and INV4 are supplied as an output from the latch circuit to the next stage, and at the same time are supplied to the inverter INV5. An output from the inverter INV5 is supplied to the transfer gate LC2. The transfer gate LC2 supplies this output to the input of the inverter INV3 at the timings of the clock signals CK and CKB, thereby latching the received signal.

In this case, when the control signal CS of high level and the control signal CSB of low level are output, the transistors $T_{S6}$ and $T_{S5}$ are turned on. This section serves as a high-speed D flip-flop master portion in accordance with operations of the transistors constituting the inverters INV3, INV4, and INV5 and the transistors constituting the transfer gates LC1 and LC2.

When the control signals CS and CSB are not selected, the NMOS transistors $T_{S6}$ and $T_{S5}$ are kept off, and the CMOS inverter INV3 constituted by the low-threshold transistors is kept off. However, since the inverters INV4 and INV5 constituted by the high-threshold transistors connected in parallel with the inverter INV3 and the transfer gate LC2 hold the data, the data in the latch circuit is not destroyed. In addition, since this latch circuit is connected to the power lines PL1 and PL2 through the high-threshold transistors $T_{S6}$ and $T_{S5}$, no increase in power consumption in the OFF state occurs.

Figure 2:
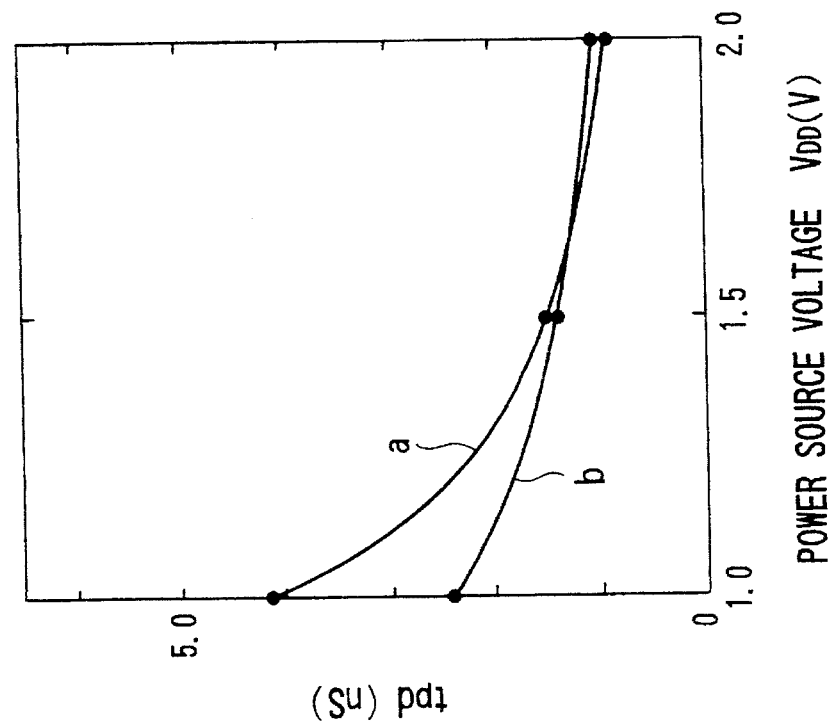
FIG. 2 is a graph showing delay times as a function of power supply voltages in a conventional example and the logic circuit of the embodiment shown in FIG. 1.
Figure 12:
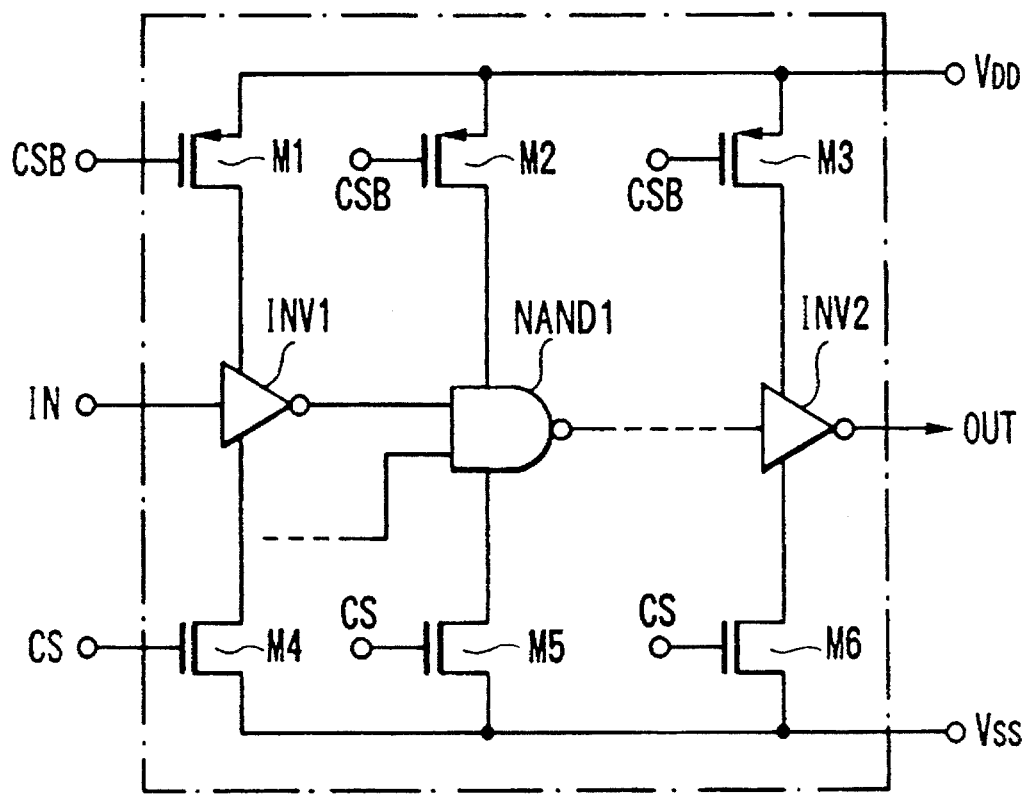
FIG. 12 is a system diagram showing a conventional logic circuit.

FIG. 2 is a graph showing effects of the logic circuit of the present invention and the conventional logic circuit. The power supply voltage $V_{DD}$ is plotted along the abscissa, and the delay time tpd is plotted along the ordinate. A characteristic curve a represents a relationship between the delay time and the power supply voltage when the logic circuit shown in FIG. 12 is used. A characteristic curve b represents a relationship between the delay time and the power supply voltage when the logic circuit according to the present invention is used. When the logic circuit according to the present invention is used at the power supply voltage of 1 V, an increase in power consumption in the OFF state does not occur. As compared with the conventional logic circuit, the delay time can be shortened by 50%.

As described above, when the logic circuit of the present invention is used, a high-speed operation can be performed even with a decrease in power supply voltage since a transistor having a low-threshold voltage is used. In addition, in the OFF state, since the logic circuit can be kept off by a transistor having a high threshold voltage, thereby reducing the power consumption.

Figure 3:
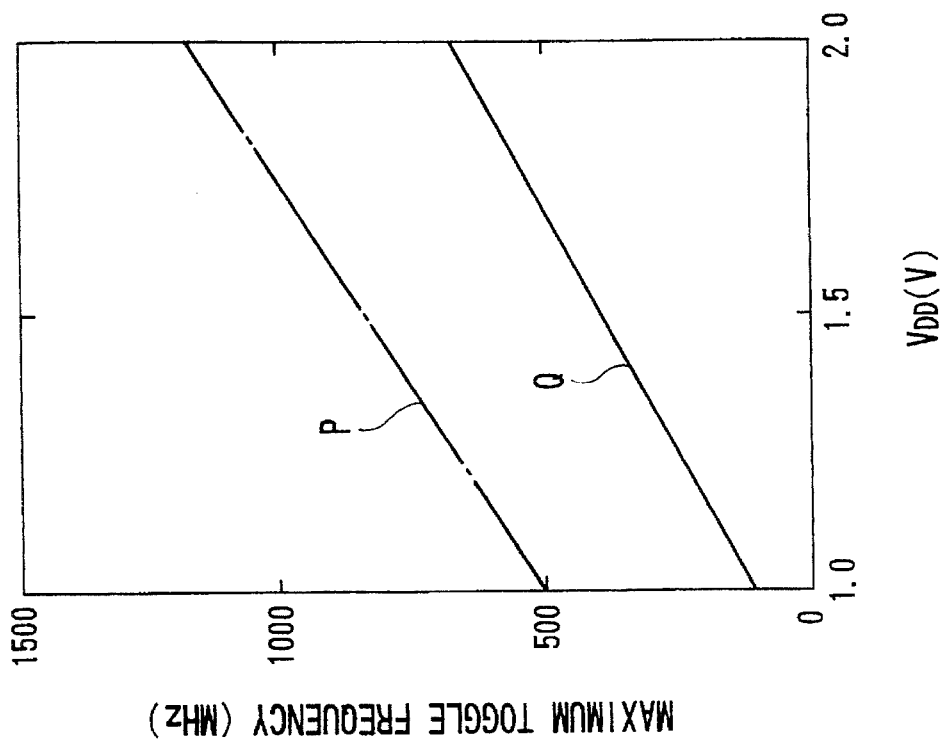
FIG. 3 is a graph showing maximum toggle frequencies as a function of power supply voltages in the conventional example and the logic circuit of the embodiment shown in FIG. 1.

FIG. 3 shows frequency characteristics of the logic circuit of the present invention, and particularly, the latch circuit as the latter stage of the logic circuit. The maximum toggle frequency serving as the maximum frequency of the clock signal (CK) for normally operating the latch circuit is plotted along the ordinate, and the power supply voltage is plotted along the abscissa. In FIG. 3, a characteristic line P represents the frequency characteristics in use of the logic circuit of the present invention, and a characteristic line Q represents the frequency characteristics in use of the conventional logic circuit.

Referring to FIG. 3, the maximum toggle frequency of the logic circuit of the present invention is 500 MHz at the power supply voltage of 1 V, while the maximum toggle frequency of the conventional logic circuit is 100 MHz at the same power supply voltage. When the logic circuit of the present invention is used, the maximum toggle frequency of the D flip-flop can be increased five times that of the conventional logic circuit without increasing the power consumption in the OFF state.

FIG. 4 shows another embodiment of the present invention. Most of the circuit of this embodiment is substantially the same as that of the embodiment in FIG. 1, so that only a portion required to explain the embodiment of FIG. 4 is accurately illustrated. That is, in the embodiment of FIG. 4, capacitors C1 and C2 are connected between a dummy power line QL1 and a power line PL1 and between a dummy power line QL2 and a power line PL2, respectively, thereby reducing the power supply voltage variations at nodes N2 and N1 between the dummy power lines and the power lines of a low-$V_{th}$ logic circuit 20. When the capacitances of these capacitors are increased, the delay time of the operation of this circuit can be shortened, and a higher-speed operation than that in the embodiment of FIG. 1 can be achieved. In this case, the capacitors C1 and C2 are connected between the substrate and the drain of a transistor $T_{S1}$ and between the substrate and the drain of a transistor $T_{S2}$ in a practical device. With this arrangement, an increase in capacitance can be achieved by increasing the width of the dummy power lines, and no special capacitance increase process is required.

FIG. 5 shows still another object of the present invention and, more particularly, a modification of the latch circuit. The same reference numerals as in FIG. 1 denote the same functions in FIG. 5 since only the layout is modified. More specifically, in FIG. 5, a series-connected arrangement of an inverter INV3 and control transistors $T_{S5}$ and $T_{S6}$ is connected to the input of a transfer gate LC1. With this arrangement, the same operation as in FIG. 1 can be performed although signal input operations are divided. A series-connected arrangement of the control transistor $T_{S5}$, the inverter INV3, and the control transistor $T_{S6}$ may be connected to the input or output of the transfer gate LC1 in the circuit of FIG. 1. However, the delay time of the arrangement in FIG. 5 can be decreased by a time corresponding to one inverter than that of the arrangement of the above modification.

Figure 6:
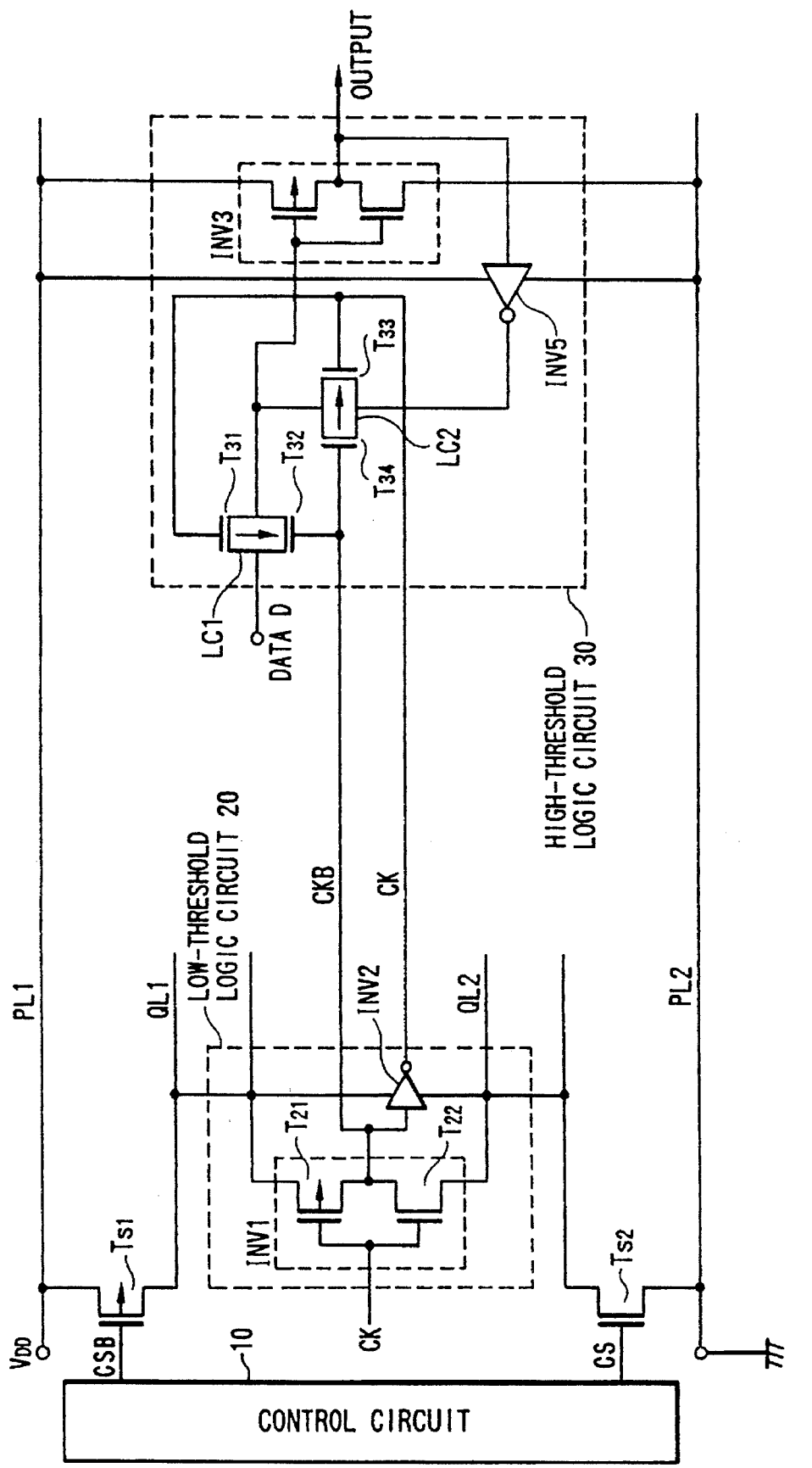
FIG. 6 is a system diagram showing another embodiment of the present invention.

FIG. 6 shows still another embodiment and, more particularly, a modification of the latch circuit in FIG. 1. In this embodiment, a series-connected arrangement of an inverter INV3 and control transistors $T_{S5}$ and $T_{S6}$ is omitted. With this arrangement, a circuit 30 can be operated as a latch circuit as in the operations of FIGS. 1 and 4.

Figure 7:
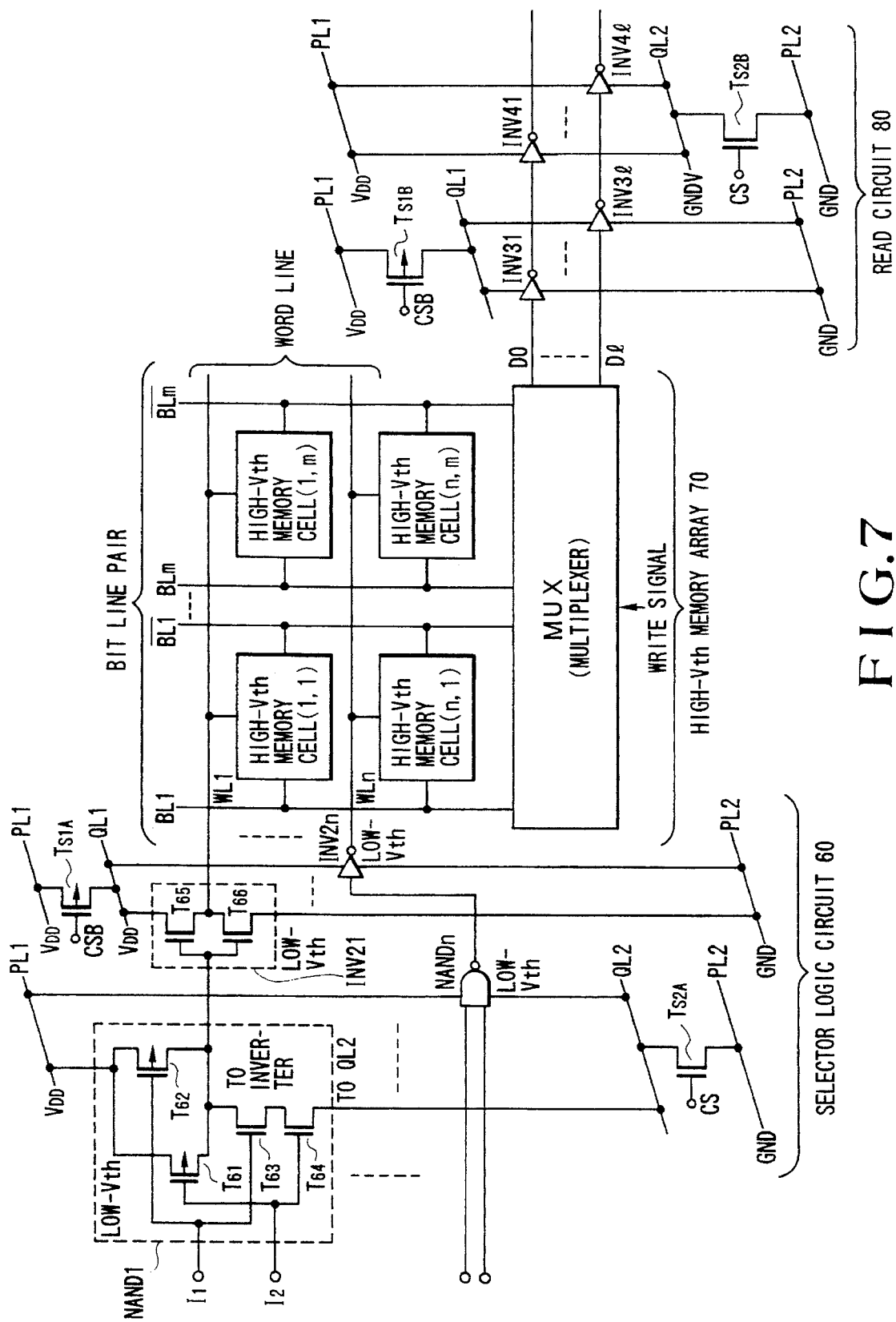
FIG. 7 is a system diagram showing still another embodiment of the present invention.
Figure 8:
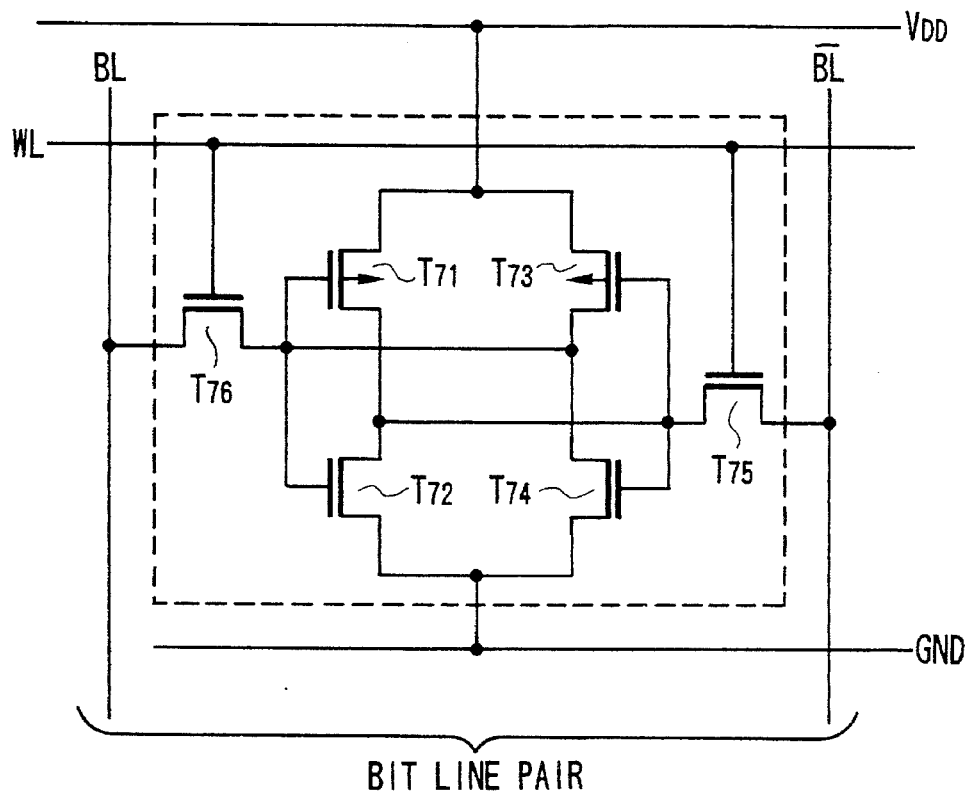
FIG. 8 is a circuit diagram showing a detailed arrangement of memory cells shown in FIG. 7.

FIGS. 7 and 8 show still another embodiment and, more particularly, a memory device to which the present invention is applied. In this embodiment, of the logic circuit group obtained by cascade-connecting MOS selector logic circuits constituted by MOSFETs having a low threshold voltage, the logic circuit of the latter stage is connected to one (QL1 in this embodiment) of dummy power lines, and the logic circuit of the former stage is connected to the other dummy power line (QL2 in this embodiment), thereby controlling floating of the output potential.

FIG. 7 shows a selector logic circuit 60 constituted by 2-input NAND gates NAND1 to NANDn and inverters INV21 to INV2n. One end of the power source terminal of each of the 2-input NAND gates NAND1 to NANDn is connected to a power line PL1, and the other end of the power source terminal of each of the NAND gates NAND1 to NANDn is connected to the dummy power line QL2. This dummy power line QL2 is connected to a power line PL2 through a control transistor $T_{S2A}$. Each NAND gate used here is constituted by low-$V_{th}$ CMOS transistors. As shown in FIG. 7, each NAND gate comprises parallel-connected p-channel MOS transistors T61 and T62 and n-channel MOS transistors T63 and T64 series-connected to the sources of the transistors T61 and T62. The gate electrodes of the transistors T62 and T63 are commonly connected to one input terminal $I_1$, and the gate electrodes of the transistors T61 and T64 are commonly connected to the other input terminal $I_2$.

Each of the inverters INV21 to INV2n is arranged in the same manner as the inverter shown in FIG. 1 and comprises two series-connected low-$V_{th}$ transistors T65 and T66. One of the output electrodes of the transistor T65 is connected to the dummy power line QL1, and this dummy power line QL1 is connected to the power line PL1 ($V_{DD}$ in this embodiment) through a common control transistor $T_{S1A}$. One of the output electrodes of the transistor T66 is directly connected to the power line PL2 (ground in this embodiment) without going through any dummy power line.

Two inputs are supplied to each of the NAND gates NAND1 to NANDn, and an output from each NAND gate is supplied to the input of a corresponding one of the inverters INV21 to INV2n. Outputs from the inverters INV21 to INV2n are supplied to the corresponding cells of a memory cell array 70 through word lines WL1 to WLn, respectively.

The memory cell array 70 is constituted by cells arranged in an n×m matrix. As shown in FIG. 8, each memory cell comprises a pair of a series-connected arrangement of p- and n-channel high-$V_{th}$ CMOS transistors T71 and T72 and a series-connected arrangement of p- and n-channel high-$V_{th}$ CMOS transistors T73 and T74, which are arranged between power lines PL1 and PL2, an n-channel high-$V_{th}$ transistor T75 arranged between a bit line BLB ($\overline{BL}$) constituting a bit line pair with a bit line BL and a connecting point between the transistors T73 and T74, and an n-channel high-$V_{th}$ transistor T76 arranged between the bit line BL and a connecting point between the transistors T71 and T72. The connecting point between the transistors T71 and T72, the gate electrodes of the transistors T73 and T74, and one of the output electrodes of the transistor T75 are commonly connected. Similarly, the connecting point between the transistors T73 and T74, the gate electrodes T71 and T72, and one of the output electrodes of the transistor T76 are commonly connected. The other output electrode of the transistor T76 is connected to the bit line BL and a multiplexer MUX. The other output electrode of the transistor T75 is connected to the bit line BLB (BL) and the multiplexer MUX. The word line WL is connected to the gate electrodes of the transistors T76 and T75. When a signal of high level is supplied to the word line WL, the potential at the connecting point between the transistors T71 and T72 and the potential at the connecting point between the transistors T73 and T74 are extracted as signals. The inputs are multiplexed into l outputs by the multiplexer MUX. These l multiplexer outputs DO to Dl are supplied to a read circuit 80.

The read circuit 80 is also arranged in the form of two stages as in the selector logic circuit 60. One of the power source terminals of INV31 to INV3l to which the multiplexer outputs DO to Dl are supplied from the memory cell array 70 is connected to the dummy power line QL1, and to the power line PL1 ($V_{DD}$ in this embodiment) through a control transistor $T_{S1B}$. This one power source terminal is then connected to the other power source terminal PL2 (ground in this embodiment) of the inverters INV31 to INV3l.

One of the power source terminals of inverters INV41 to INV4l which respectively receive the outputs from the inverters INV31 to INV3l is connected to the dummy power line QL2 and to the power line PL2 (ground in this embodiment) through a control transistor $T_{S2B}$. This one power source terminal is then connected to one power source terminal PL1 ($V_{DD}$ in this embodiment) of the inverters INV41 to INV4l.

With this arrangement, the operation of the selector logic circuit 60 in the non-selection mode will be described below.

In this case, since the control signal supplied to the control transistor $T_{S2A}$ for controlling the NAND gates NAND1 to NANDn of the former stage in the selector logic circuit 60 is set at a low potential, the transistor $T_{S2A}$ is kept off. Since the input terminals $I_1$ and $I_2$ of the NAND gates are set at a non-selection state, they are set at a low potential. The transistors T61 and T62 are turned on to set the dummy power line QL2 at the high voltage $V_{DD}$. At this time, in the inverters of the latter stage (e.g., INV21), since the control signal CSB applied to the control transistor $T_{S1A}$ is set at a high potential, the control transistor $T_{S1A}$ is set in an OFF state. At this time, since the transistor T66 is set in an ON state, an output from the inverter INV21 is set at the low potential. As a result, as described above, a high-speed operation of the logic circuit in a selection mode and low power consumption in a non-selection mode can be achieved.

In this embodiment, the control transistor on the NAND gate side is set at the low potential and the control transistor on the inverter side is set at the high potential. However, the control transistor on the NAND gate side may be set at the high potential, and the control transistor on the inverter side may be set at the low potential, as a matter of course. It is easily anticipated for those who are skilled in the art to arrange this selector logic circuit by using logic circuit elements except for the logic circuit elements used here. The number of stages of the logic circuit is not limited to two, and it is easily anticipated to set the number of stages to be three or more. In this case, the polarity (high or low potential) of the power source in which a high-$V_{th}$ MOS transistor is inserted is determined so that a high-$V_{th}$ MOSFET is connected in series between the logic circuit of the former stage and a power source having a polarity opposite to that of the logic circuit of the latter stage.

The read circuit 80 is arranged in the form of two stages as in the selector logic circuit. In the former stage to which the outputs from the multiplexer MUX are supplied, power supply to the inverters INV31 to INV3l constituted by the low-$V_{th}$ transistors is controlled in accordance with the presence/absence of the control signals CSB supplied from the high-$V_{th}$ control transistor $T_{S1B}$. Power supply to the inverters INV41 to INV4l located on the output side of the inverters INV31 to INV3l through the dummy power line QL2 is controlled in accordance with the presence/absence of the control signal CSB supplied to the high-$V_{th}$ control transistor $T_{S2B}$. With this arrangement, a high-speed operation of the logic circuit in a selection mode and low power consumption of the logic circuit in a non-selection mode can be achieved.

Figure 9:
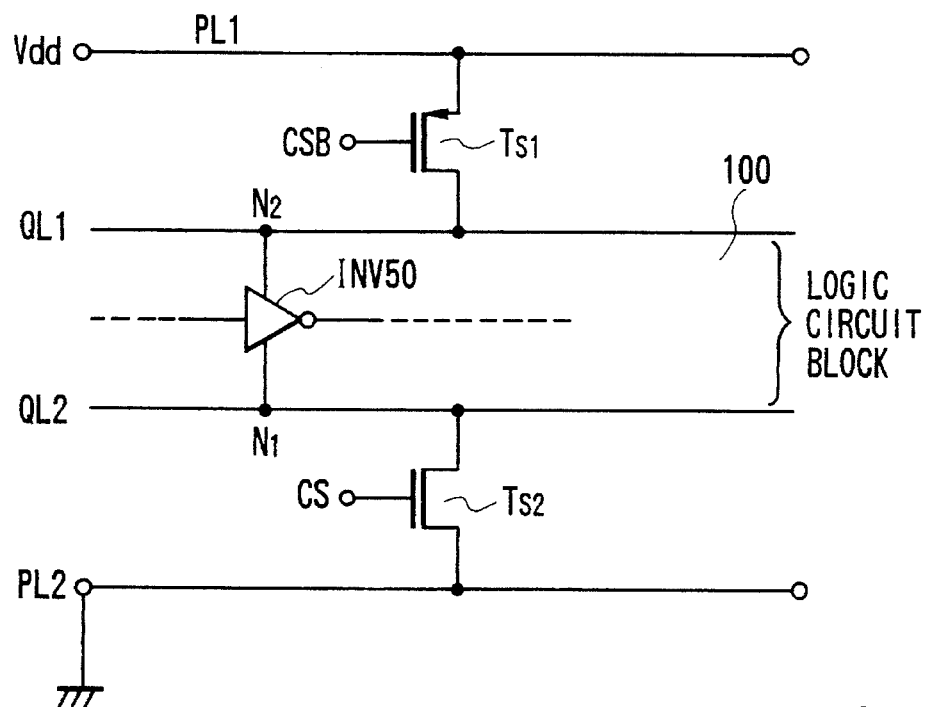
FIG. 9 is a system diagram showing still another embodiment of the present invention.
Figure 10:
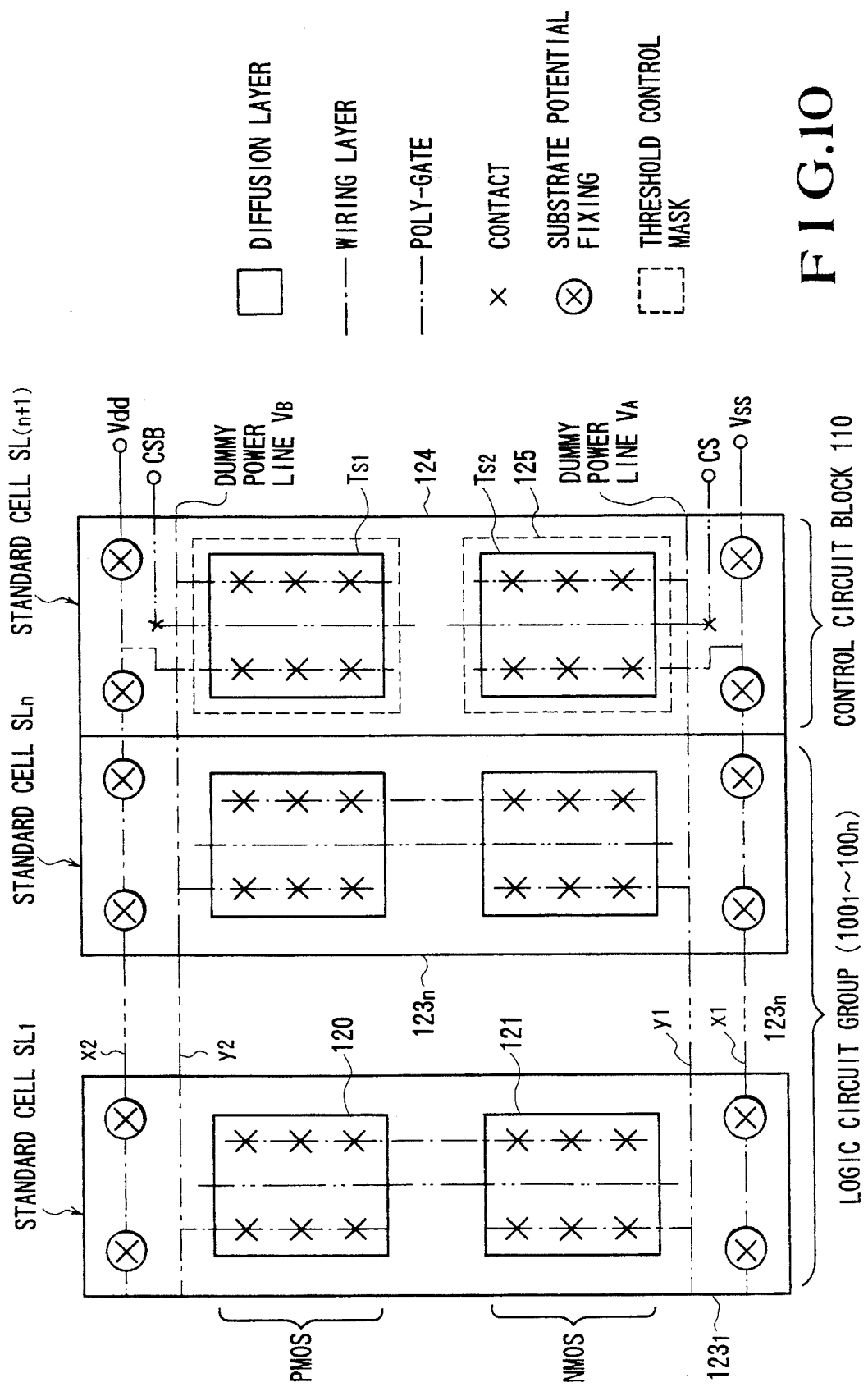
FIG. 10 is a view showing still another embodiment in which the arrangement in FIG. 9 is applied to an actual memory cell structure.

FIG. 9 shows still another embodiment and, more particularly, a memory device to which the present invention is applied. In this embodiment, a logic circuit block 100 comprises a plurality of cascade-connected CMOS inverters INV50. The power sources of these inverters INV50 are connected to dummy power lines QL1 and QL2 at nodes N1 and N2. These dummy power lines are connected to power lines PL1 and PL2 through control transistors $T_{S1}$ and $T_{S2}$, respectively. The same reference symbols as in the above embodiment denote the same functions in this embodiment. FIG. 10 shows an arrangement in which a logic circuit having such a basic arrangement is used in a memory device.

FIG. 10 shows the layout of a memory device having standard cells. This memory device comprises standard cells $SL_1$ to $SL_{(n+1)}$. Each standard cell corresponds to one logic circuit block 100. Standard cells 1 to n constitute a logic circuit group constituted by logic circuit blocks 1001 to 100n. The standard cell (n+1) corresponds to the control circuit block 110 (corresponding to the transistors $T_{S1}$ and $T_{S2}$ in FIG. 1). In this embodiment, the control circuit block 100 is located to the right of the logic circuit group. Referring to FIG. 10, threshold control masks are not included in diffusion layers 120 and 121 in the n- and p-channel MOS transistors constituting the logic circuit block standard cell.

Although the threshold control mask is used for the high threshold voltage, it may be used for the low threshold voltage.

Each standard cell is connected to power lines x1 and x2 (corresponding to PL1 and PL2 in the above embodiments) and dummy power lines y1 and y2 (corresponding to QL1 and QL2 of the above embodiments) which are fixed on a substrate, and the wiring layer in the standard cell is a polysilicon wiring layer used for the gate (poly-gate) of the transistor.

The logic circuit group receives the power from the dummy power lines having a large line width through the dummy power lines y1 and y2 and the power lines x1 and x2. The substrate potential of each transistor constituting the logic circuit is applied from the power lines PL1 and PL2. The control block of the standard cell (n+1) has a threshold control mask 125 for each of the transistors $T_{S1}$ and $T_{S2}$. The control transistors $T_{S1}$ and $T_{S2}$ apply voltages to the dummy power lines y1 and y2 through the power lines x1 and x2 as in the logic circuit group.

With the above arrangement, when the control signals CS and CSB are selected, the control transistors $T_{S1}$ and $T_{S2}$ are turned on to apply the power supply voltages to the dummy power lines y1 and y2. At this time, the threshold voltage of each transistor constituting the inverter block INV50 in the logic circuit group is lower than that of the control transistor and at the same time large source capacitances of the respective transistors and hence their large parasitic capacitances are set in the dummy power lines y1 and y2, so that a voltage drop in the dummy power lines y1 and y2 is small. Therefore, the inverters (i.e., the logic circuit group) can be operated at high speed.

When the control signals CS and CSB are not selected, the control transistors are turned off, and the power supply voltages are not applied to the dummy power lines y1 and y2. Therefore, the inverters INV50 constituting the logic circuit group are kept off. At this time, since the threshold voltage of each of the control transistors $T_{S1}$ and $T_{S2}$ is set higher than that of each internal transistor constituting the inverter circuit, a current flowing in the OFF state of the control transistors $T_{S1}$ and $T_{S2}$ is small. An increase in power consumption in the OFF state does not occur.

The layout of the standard cells of this embodiment can be achieved by simply arranging the control transistors next to the logic circuit group. Therefore, the area of the layout can be reduced as compared with the conventional standard cell scheme when the circuit scale is increased.

In this embodiment, the control circuit or transistor block is located to the right of the logic circuit group. However, the control transistor block may be located at all other position, e.g., to the left, above, or below the logic circuit group.

Figure 11:
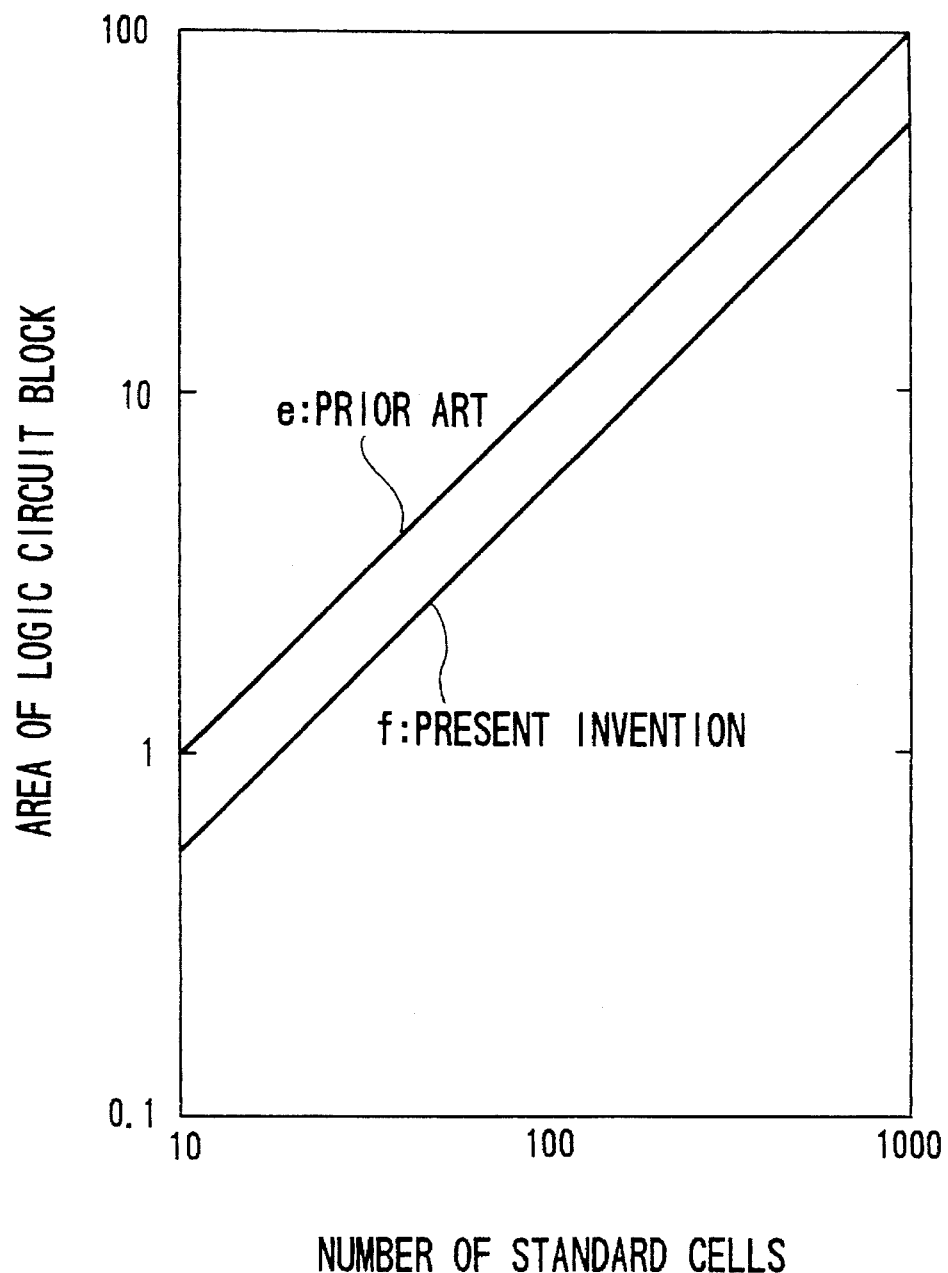
FIG. 11 is a graph showing the areas of logic circuit blocks as a function of the numbers of standard cells in the conventional example and the embodiment shown in FIG. 10.

FIG. 11 is a graph showing the effect of the embodiment of FIG. 10. The area of the logic circuit block is plotted along the ordinate, and the number of standard cells is plotted along the abscissa. Referring to FIG. 11, a characteristic line represents the area of the conventional circuit arrangement, and a characteristic line f represents the area of the circuit arrangement of the present invention. In this case, these areas are normalized using an area realized by ten conventional standard cells. As can be apparent from these characteristics, the area can be reduced to about ½ that of the conventional arrangement.

What is claimed is:

1. A circuit comprising:

a logic circuit having a plurality of logic circuit elements each comprised of a plurality of field effect transistors;

first and second power lines for supplying power to said logic, with said first power line connected to a power source and with said second power line connected to a ground;

a first dummy power line connected to one of a plurality of power source terminals of said logic circuit; and a first control transistor connected between said first dummy power line and said first power line, said first control transistor having a threshold substantially greater than thresholds of said field effect transistors of said logic circuit.

2. A circuit according to claim 1, further comprising:

a second dummy power line connected to a remaining one of said power source terminals of said logic circuit; and a second control transistor connected between said second dummy power line and said second power line, said second control transistor having a threshold greater than thresholds of said field effect transistors of said logic circuit.

3. A circuit according to claim 1, further comprising a capacitor connected between said first dummy power line and said first power line providing capacitance in addition to any parasitic capacitance between the first dummy power line and the first power line.

4. A circuit according to claim 2, further comprising first and second capacitors respectively connected between said first and second dummy power lines and said first and second power lines.

5. The circuit of claim 2 further comprising a first clock signal applied to said first high threshold transistor; and a second clock signal applied to said second high threshold transistor.

6. The circuit of claim 5 wherein:

said second clock signal is said first clock signal inverted.

7. A circuit comprising:

a first logic circuit having a logic circuit element comprised of a plurality of field effect transistors;

first and second power source lines for supplying power to said first logic circuit, with said first power line connected to a power source and with said second power line connected to a ground;

a first dummy power line connected to one of a plurality of power source terminals of said logic circuit;

a first control transistor connected between said first dummy power line and said first power line and having a threshold greater than thresholds at the field effect transistors of the first logic circuits;

a second dummy power line connected to a remaining one of said power source terminals of said first logic circuit;

a second control transistor connected between said first dummy power line and said second power line having a threshold substantially greater than thresholds of said field effect transistors of said first logic circuit;

a second logic circuit, an operation of which is controlled by an output from said first logic circuit;

said second logic circuit having power source terminals connected to said first and second power source lines.

8. A circuit according to claim 7, wherein said second logic circuit comprises:

a plurality of field effect transistors with one of a plurality of power source terminals of said first logic circuit connected to said first dummy power line; and a third control transistor connected between said first dummy power line and said first power line.

9. A circuit according to claim 8, wherein a remaining one of said power source terminals of said second logic circuit is connected to said second dummy power line, and a fourth control transistor connected between said second dummy power line and said second power line and having a threshold substantially greater than thresholds of said field effect transistors of said first and second logic circuits.

10. A circuit layout comprising a plurality of logic blocks each having a control circuit block formed on an integrated circuit substrate, with each of said logic circuit blocks including a logic circuit having a logic circuit element comprised of a plurality of field effect transistors;

first and second power source lines for supplying power to said low-threshold logic circuit with said first power line connected to a power source and with said second power line connected to a ground;

a first dummy power line connected to one of a plurality of power source terminals of said logic circuit, and a second dummy power line connected to a remaining one of said power source terminals of said logic circuit, and with said control circuit block including a first field effect control transistor arranged between said first dummy power line and said first power line, with said first control transistor having a threshold substantially greater than thresholds of said field effect transistors of said logic circuit, and a second field effect control transistor arranged between said second dummy power line and said second power line with said first control transistor having a threshold substantially greater than thresholds of said field effect transistors of said logic circuit, with said plurality of control circuit blocks connected to said logic circuit block.

11. A logic circuit comprising at least first and second stages, each of which comprises a low-threshold logic circuit having a plurality of logic circuit elements, each of said logic circuit elements being comprised of a plurality of field effect transistors;

first and second power lines for supplying power to said low threshold logic circuit, said first power line being connected to a power source, said second power line being connected to a ground;

a dummy power line being connected to one of power source terminals of said low-threshold logic circuit; and a high-threshold control transistor being connected to one of said power line, said high-threshold control transistor having a threshold substantially greater than that of said field effect transistors of said low-threshold logic circuit, said first stage comprising:

a first low-threshold logic circuit having a plurality of logic circuit elements, each of said logic circuit elements being comprised of a plurality of field effect transistors, one of plural power source terminals of said first low-threshold logic circuit being connected to a first dummy power line, and the remaining one of said plural power source terminals of said first low-threshold logic circuit being connected to said second power line;

a first high-threshold control transistor being connected between said first dummy power line and said first power line, said first high-threshold control transistor having a threshold substantially greater than that of said field effect transistors of said first low-threshold logic circuit; and said second stage, next to said first stage, comprising:

a second low-threshold logic circuit having a plurality of logic circuit elements, each of said logic circuit elements being comprised of a plurality of field effect transistors, one of said plural power source terminals of said second low-threshold logic circuit being connected to a second dummy power line, and the remaining one of said plural power source terminals of said second low-threshold logic circuit being connected to said first power line;

a second high-threshold control transistor being connected between said second dummy power line and said second power line, said second high-threshold control transistor having a threshold substantially greater than that of said field effect transistors of said second low-threshold logic circuit.

* * * * *